(12) United States Patent
Lin

(10) Patent No.: US 12,284,777 B2
(45) Date of Patent: Apr. 22, 2025

(54) ELECTRONIC DEVICE AND SUPPORTING MEMBER THEREOF

(71) Applicant: Wistron Corp., New Taipei (TW)

(72) Inventor: Wei-Fan Lin, New Taipei (TW)

(73) Assignee: Wistron Corp., New Taipei (TW)

( * ) Notice: Subject to any disclaimer, the term of this patent is extended or adjusted under 35 U.S.C. 154(b) by 0 days.

(21) Appl. No.: 17/853,791

(22) Filed: Jun. 29, 2022

(65) Prior Publication Data

US 2023/0301012 A1   Sep. 21, 2023

(30) Foreign Application Priority Data

Mar. 18, 2022   (TW) .................................. 111110046

(51) Int. Cl.
*H05K 7/14*        (2006.01)

(52) U.S. Cl.
CPC .................................. *H05K 7/1489* (2013.01)

(58) Field of Classification Search
CPC .. H05K 7/1461; H05K 7/1402; H05K 7/1404; H05K 7/1424; H05K 7/1431; G06F 1/185; G06F 1/186; G06F 1/187
See application file for complete search history.

(56) References Cited

U.S. PATENT DOCUMENTS

| | | | | |
|---|---|---|---|---|
| 5,909,359 A  * | 6/1999 | Summers | ............. | H05K 7/1429 206/706 |
| 6,381,149 B1 * | 4/2002 | Megason | ............. | H05K 7/1405 361/801 |
| 11,129,291 B1 * | 9/2021 | Liu | ....................... | H05K 7/1408 |
| 2007/0004264 A1 * | 1/2007 | Brown | .................... | G06F 1/185 439/351 |
| 2013/0070421 A1 * | 3/2013 | Zhou | .................... | H05K 7/1417 361/724 |
| 2013/0107441 A1 * | 5/2013 | Zhou | ....................... | G06F 1/185 248/298.1 |
| 2014/0168910 A1 * | 6/2014 | Yin | ........................ | G06F 1/186 361/747 |
| 2015/0115120 A1 * | 4/2015 | Yu | .......................... | G06F 1/186 248/220.21 |
| 2022/0404880 A1 * | 12/2022 | Xu | .......................... | G06F 1/183 |

FOREIGN PATENT DOCUMENTS

| | | |
|---|---|---|
| CN | 101764299 B | 6/2012 |
| CN | 113031720 A | 6/2021 |
| TW | M390032 U | 10/2010 |
| TW | 201526402 A | 7/2015 |

* cited by examiner

*Primary Examiner* — James Wu
*Assistant Examiner* — Christopher L Augustin

(57) ABSTRACT

An electronic device is provided. The electronic device includes a bracket, a supporting member, a fastener and a processor module. The bracket includes a slot. In a fixed state, the fastener is adapted to affix the supporting member in the slot. In an adjustment state, the supporting member is adapted to be slid relative to the slot. The supporting member is connected to the processor module to restrict the processor module.

19 Claims, 16 Drawing Sheets

ELECTRONIC DEVICE AND SUPPORTING MEMBER THEREOF

CROSS REFERENCE TO RELATED APPLICATIONS

This application claims priority of Taiwan Patent Application No. 111110046, filed on Mar. 18, 2022, the entirety of which is incorporated by reference herein.

BACKGROUND OF THE INVENTION

Field of the Invention

The present invention relates to a supporting member, and in particular to a supporting member used to support a processor module.

Description of the Related Art

In the current server device, more and more processor modules, such as graphics processing units (GPUs), are utilized to assist in computing. A graphics processing unit (GPU) generally has different specifications, such as 9.5 inches and 10.5 inches. In addition, the server device can also utilize another processor module, such as a general full-length PCIE card (12.283 inches). Conventionally, one single server device can only match one specific processor module. It is difficult for one single server device to be compatible with the graphics processing unit modules (GPUs) of various sizes and the general full-length PCIE cards (12.283 inches) simultaneously.

BRIEF SUMMARY OF THE INVENTION

Embodiments of the invention are provided to address the aforementioned difficulty.

In one embodiment, an electronic device is provided. The electronic device has at least one processor module. The electronic device includes a bracket and a supporting member. The bracket comprises a slot. The supporting member is moveably affixed in the slot to restrict the processor modules of different sizes.

In one embodiment, the supporting member comprises a supporting member body and at least one wedging portion. The wedging portion is disposed on the supporting member body. In a first assembling state, the processor module comprises at least one positioning portion, and the wedging portion is inserted into the positioning portion when the supporting member is connected to the processor module.

In one embodiment, the electronic device further comprises a fastener, wherein the supporting member body is substantially L-shaped, the fastener is disposed on the first end of the supporting member body, and the wedging portion is disposed on the second end of the supporting member body.

In one embodiment, the bracket comprises a guiding groove, the guiding groove is parallel to the slot, the supporting member comprises at least one guiding portion, the guiding portion is disposed on the first end of the supporting member body, and the guiding portion is adapted to be inserted into the guiding groove and is moved along the guiding groove.

In one embodiment, the supporting member comprises a supporting trough, and in a second assembling state, the processor module comprises a substrate, and the edge of the substrate is inserted into the supporting trough when the supporting member is connected to the processor module.

In one embodiment, the supporting member further comprises a metal element and a bolt, the supporting trough is disposed on the metal element, the supporting member body has a hole, the bolt passes through the hole to affix the metal element to the supporting member body, and the metal element is adapted to be slid relative to the supporting member body.

In one embodiment, the supporting member body comprises a first side and a second side, the first side is opposite to the second side, the wedging portion is disposed on the first side, and the supporting trough is disposed on the second side.

In one embodiment, the supporting member body comprises an end portion, the end portion is located between the first side and the second side, and the fastener is connected to the end portion.

In one embodiment, the bracket comprises a first guiding groove and a second guiding groove, the first guiding groove and the second guiding groove are parallel to the slot, the supporting member comprises at least one guiding portion, the guiding portion is disposed on the end portion of the supporting member body, the guiding portion is adapted to be inserted into the first guiding groove or the second guiding groove, and is moved along the first guiding groove or the second guiding groove.

In one embodiment, the supporting trough comprises at least one tapering opening, and the edge of the substrate is inserted into the supporting trough via the tapering opening.

In one embodiment, a supporting member is provided. The supporting member is adapted to at least affix a first processor module to a bracket. The supporting member includes a supporting member body and at least one wedging portion. The supporting member body is moveably affixed to the bracket. The wedging portion is disposed on the supporting member body, wherein the wedging portion is connected to a positioning portion of the first processor module, and when the supporting member is connected to the first processor module, the wedging portion is wedged to the positioning portion.

In another embodiment, an electronic device is provided. The electronic device includes a bracket, a supporting member, a fastener and a processor module. The bracket includes a slot. In a fixed state, the fastener is adapted to affix the supporting member in the slot. In an adjustment state, the supporting member is adapted to be slid relative to the slot. The supporting member is connected to the processor module to restrict the processor module.

Utilizing the supporting member of the embodiment of the invention, the PCIE card (12.283 inches) and the graphics processing units of 9.5 inches and the 10.5 inches can be affixed in one single server device. The supporting member of the embodiment can be easily attached to and detached from the server device. The user therefore can mount the graphics processing unit (GPU) and the PCIE card easily.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
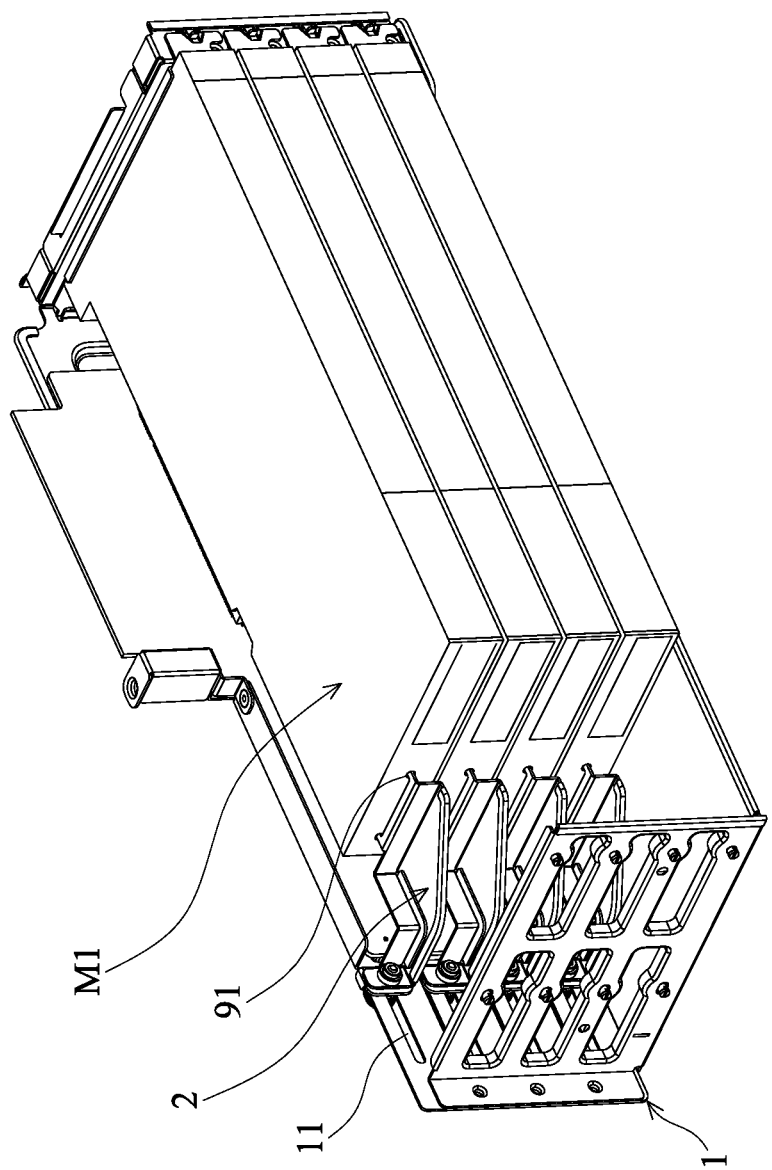
FIG. 1A is a perspective view of an electronic device of a first embodiment of the invention, wherein a first processing module is disposed in the electronic device.
Figure 1B:
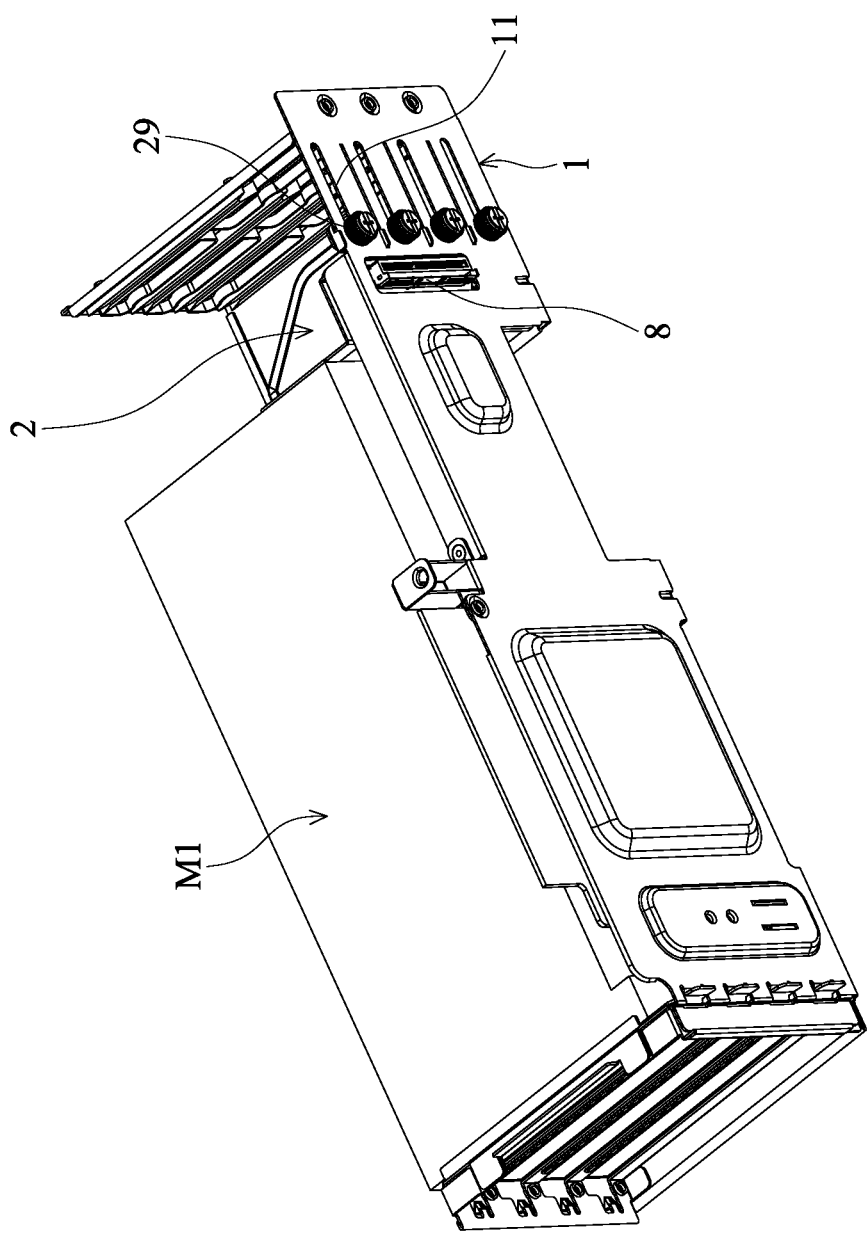
FIG. 1B is another perspective view of the electronic device of the first embodiment of the invention.

FIG. 1A is a perspective view of an electronic device of a first embodiment of the invention, wherein a first processing module is disposed in the electronic device. FIG. 1B is another perspective view of the electronic device of the first embodiment of the invention. With reference to FIGS. 1A and 1B, the electronic device of the first embodiment includes a bracket 1, a supporting member 2, a fastener 29 and a first processor module M1. The bracket 1 comprises a slot 11. In a fixed state, the fastener 29 is adapted to affix the supporting member 2 in the slot 11. In an adjustment state, the supporting member 2 is adapted to be slid relative to the slot 11. The supporting member 2 is connected to the first processor module M1 to restrict the first processor module M1.

Figure 2A:
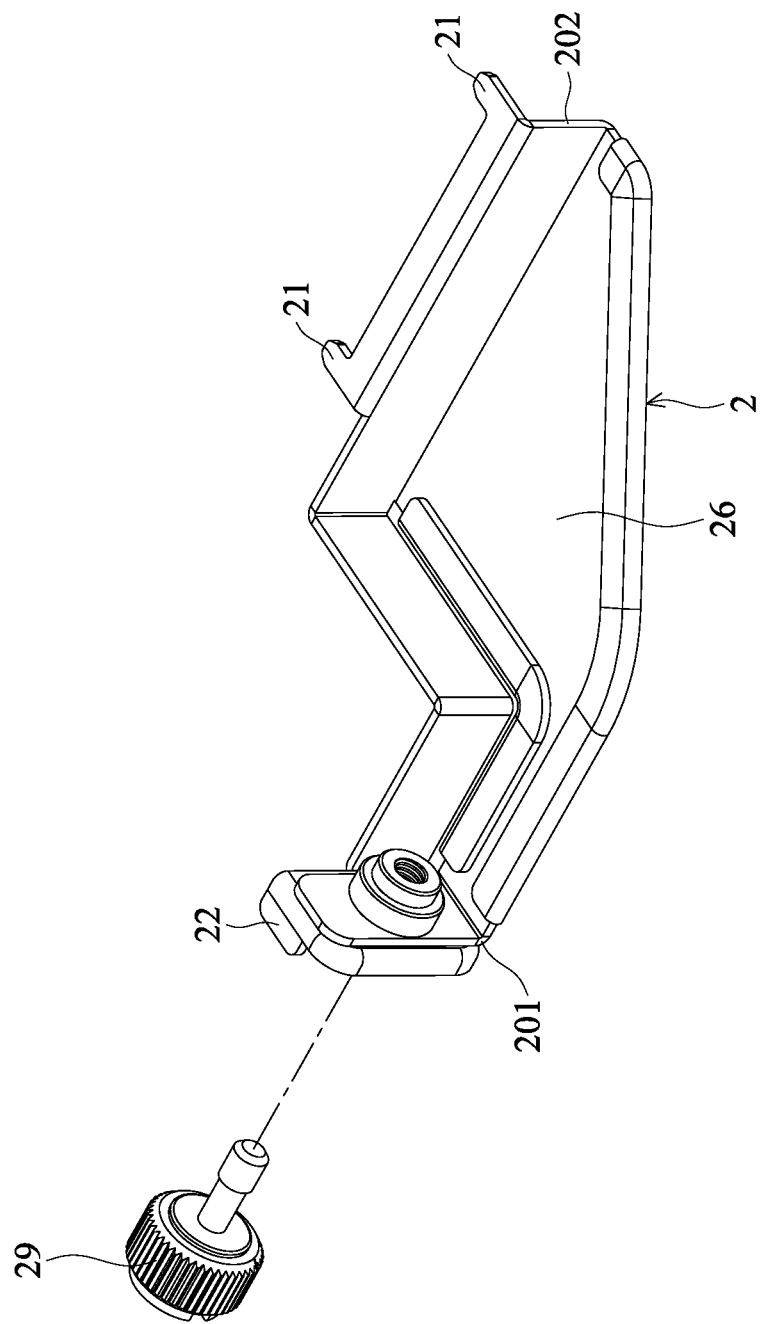
FIG. 2A shows the details of the supporting member of the first embodiment of the invention.

FIG. 2A shows the details of the supporting member of the first embodiment of the invention. With reference to FIGS. 1A and 2A, in one embodiment, the supporting member 2 comprises a supporting member body 26 and at least one wedging portion 21. The wedging portion 21 is disposed on the supporting member body 26. In a first assembling state, the first processor module M1 comprises at least one positioning portion 91. The wedging portion 21 is inserted into the positioning portion 91 when the supporting member 2 is connected to the first processor module M1. In one embodiment, the wedging portion 21 can be a post. The positioning portion 91 can be a positioning hole. The disclosure is not meant to restrict the invention.

With reference to FIGS. 1A and 2A, in one embodiment, the supporting member body 26 is substantially L-shaped. The fastener 29 is disposed on a first end 201 of the supporting member body 26. The wedging portion 21 is disposed on a second end 202 of the supporting member body 26. The fastener 29 is restricted by the disclosure of the drawings of the invention. The fastener 29 is used to affix the supporting member 2 in the slot 11.

Figure 2B:
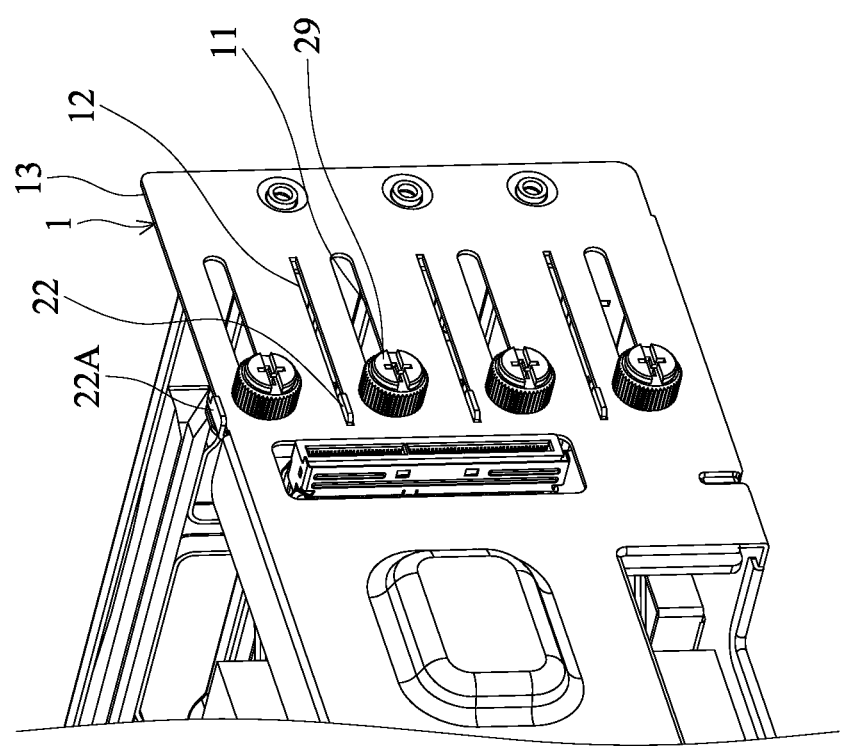
FIG. 2B shows the details of the bracket of the embodiment of the invention.

FIG. 2B shows the details of the bracket of the embodiment of the invention. With reference to FIG. 2B, in one embodiment, the bracket 1 comprises a guiding groove 12. The guiding groove 12 is parallel to the slot 11. The supporting member 2 comprises at least one guiding portion 22. The guiding portion 22 is disposed on the first end 201 of the supporting member body 26. The guiding portion 22 is adapted to be inserted into the guiding groove 12 and is moved along the guiding groove 12. Additionally, as shown in FIG. 2B, in one embodiment, the guiding portion 22A of one of the supporting member 2 slides along an edge 13 of the bracket 1.

Figure 3A:
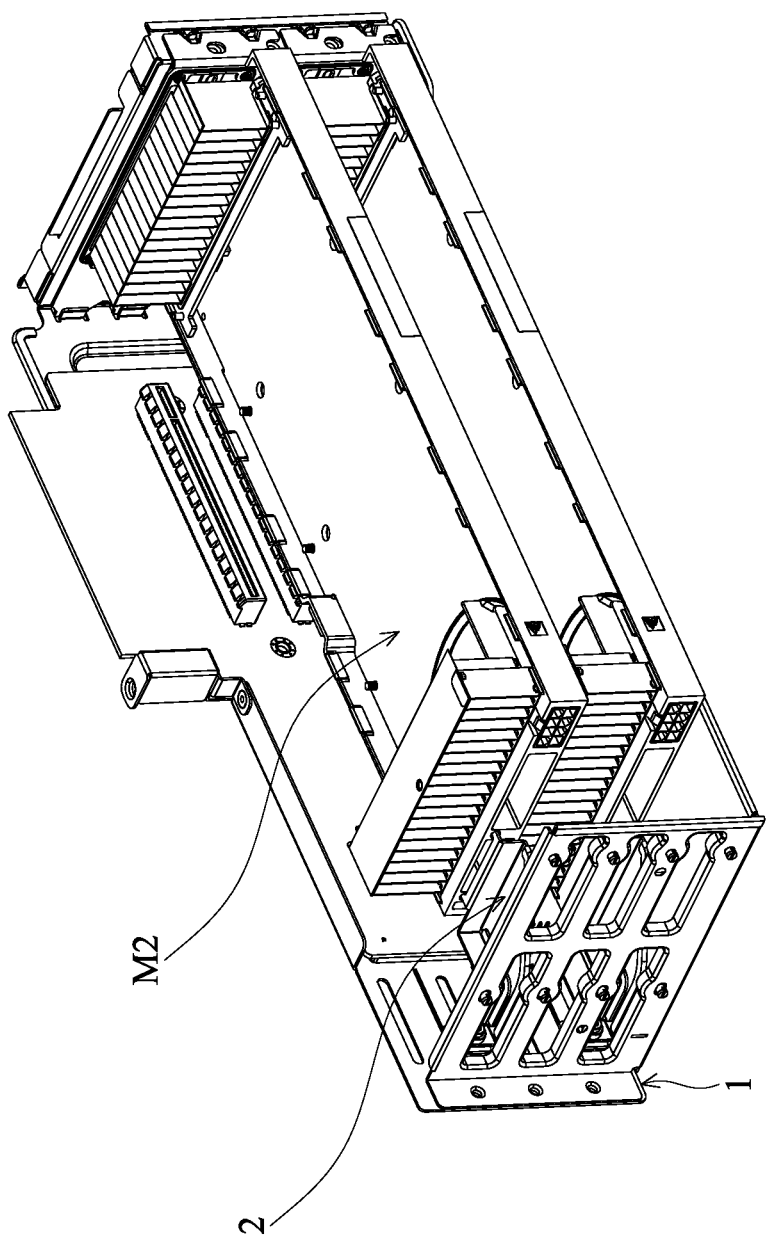
FIG. 3A shows the electronic device of the first embodiment of the invention, wherein a second processing module is disposed in the electronic device.
Figure 3B:
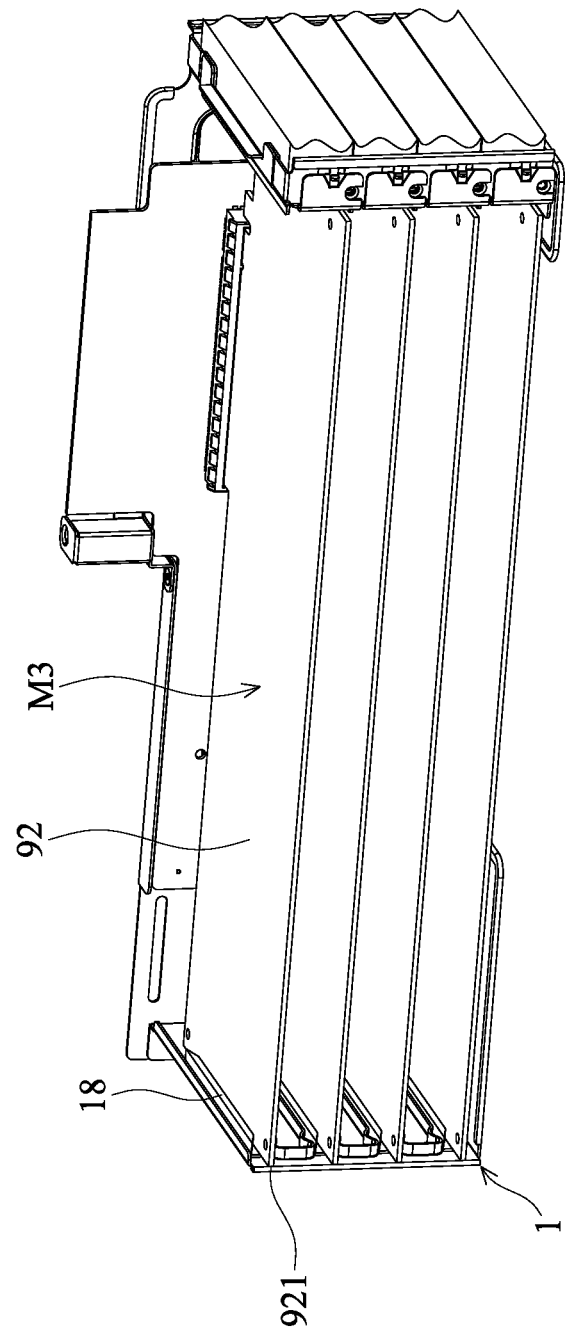
FIG. 3B shows the electronic device of the first embodiment of the invention, wherein a third processing module is disposed in the electronic device.

With reference to FIGS. 1A and 1B, in this embodiment, the first processing module M1 is a 9.5 inches processing module. FIG. 3A shows the electronic device of the first embodiment of the invention, wherein a second processing module is disposed in the electronic device. FIG. 3B shows the electronic device of the first embodiment of the invention, wherein a third processing module is disposed in the electronic device. With reference to FIG. 3A, in this embodiment, the second processing module M2 is a 10.5 inches processing module. The position of the supporting member 2 is modified according to the size of the second processing module M2, and the supporting member 2 restricts the second processing module M2. With reference to FIG. 3B, in this embodiment, the third processing module M3 is a 12.283 inches processing module. In one embodiment, the third processing module M3 is a PCIE card. The length and the wedging structure of the third processing module M3 differs from that of the first processing module M1 and the second processing module M2. In the embodiment of FIG. 3B, the supporting member is omitted, and the bracket 1 comprises a supporting trough 18. The third processor module M3 comprises a substrate 92. An edge 921 of the substrate 92 is inserted into the supporting trough 18, and the third processor module M3 is restricted by the supporting trough 18.

Figure 4A:
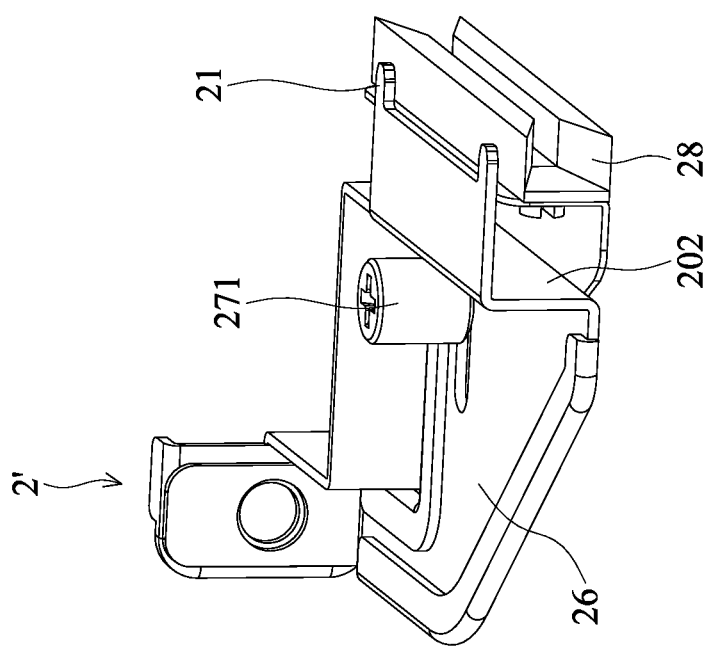
FIG. 4A is a perspective view of a supporting member of a modified embodiment of the invention.
Figure 4B:
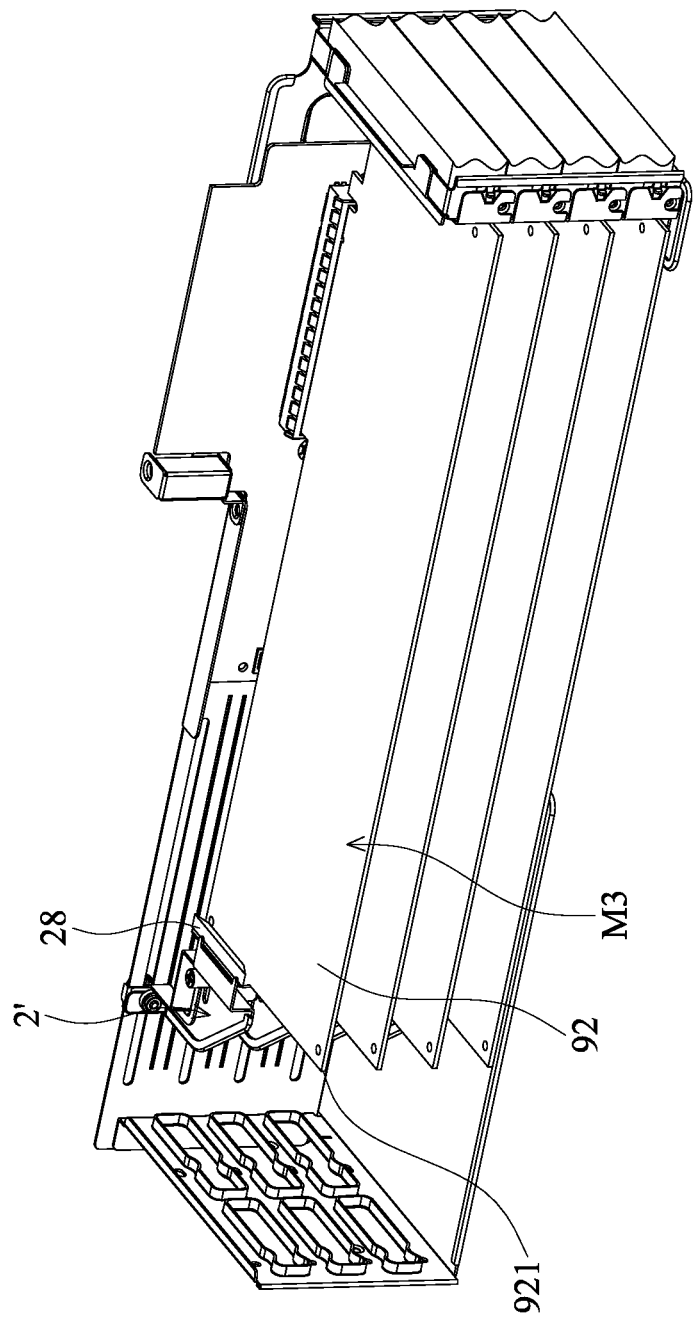
FIG. 4B shows the supporting member of the embodiment of FIG. 4A connected to the third processor module.

FIG. 4A is a perspective view of a supporting member of a modified embodiment of the invention. With reference to FIG. 4A, in this embodiment, the supporting member 2' further comprises a supporting trough 28. FIG. 4B shows the supporting member of the embodiment of FIG. 4A connected to the third processor module. With reference to FIG. 4B, in this embodiment, the electronic device utilizes the third processing module M3. The third processing module M3 is a 12.283 inches processing module. The third processor module M3 comprises a substrate 92. An edge 921 of the substrate 92 is inserted into the supporting trough 28, and the third processor module M3 is restricted by the supporting trough 28.

Figure 4C:
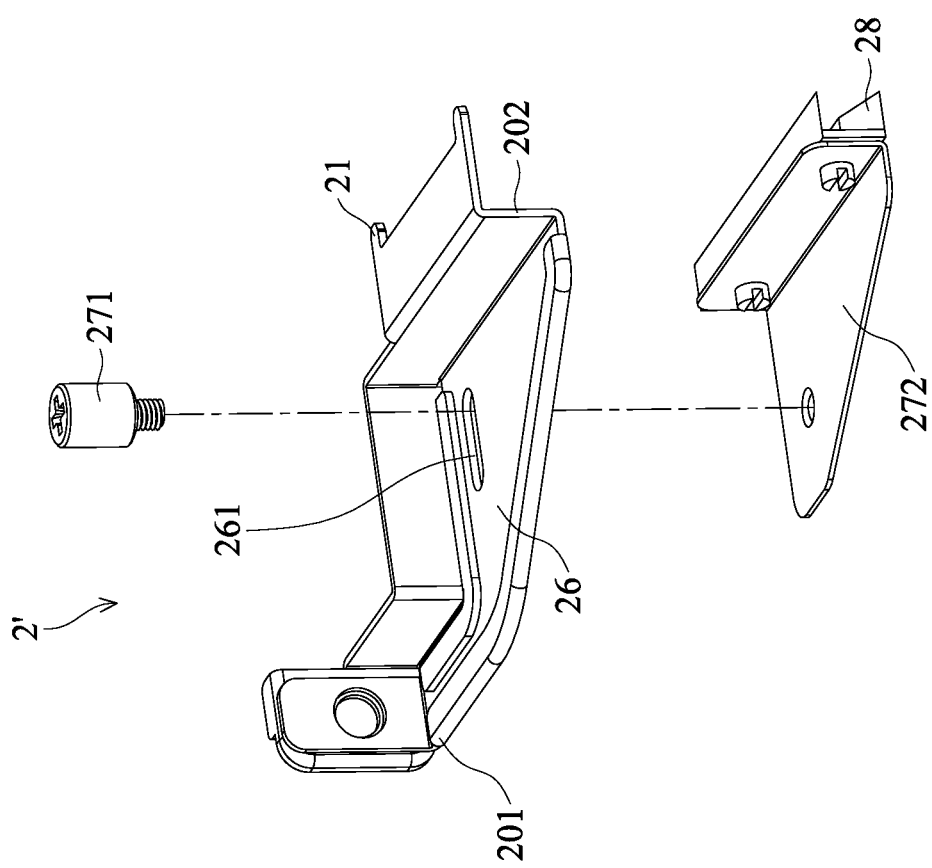
FIG. 4C is an exploded view of the supporting member of the embodiment of FIG. 4A.

FIG. 4C is an exploded view of the supporting member of the embodiment of FIG. 4A. With reference to FIG. 4C, in this embodiment, the supporting member 2' further comprises a metal element 272 and a bolt 271. The supporting trough 28 is disposed on the metal element 272. The supporting member body 26 has a hole 261. The bolt 271 passes through the hole 261 to affix the metal element 272 to the supporting member body 26. The metal element 272 is adapted to be slid relative to the supporting member body 26.

In the embodiment of FIGS. 4A, 4B and 4C, when the first processor module M1 or the second processor module M2 needs to be restricted, the supporting member 2' is moved along the slot, and the wedging portion 21 is wedged into the position portion 91 of the first processor module M1 or the second processor module M2. When the third processor module M3 (for example, PCIE card) needs to be restricted, the supporting member 2' is moved along the slot, and the edge 921 of the substrate 92 of the third processor module M3 is restricted by the supporting trough 28 (since the height of the edge 921 of the third processor module M3 differs from that of the position portion 91 of the first processor module M1 or the second processor module M2). In one embodiment, when the length of the slot 11 of the bracket 1 is limited, the position of the metal element 272 relative to the supporting member body 26 can be modified, and the supporting trough 28 thus can be connected to the edge 921 of the third processor module M3. Similarly, when the supporting member 2' is connected to the first processor module M1 or the second processor module M2, the position of the metal element 272 relative to the supporting member body 26 can be modified (backward), the supporting trough 28 is prevented from interfering with the first processor module M1 or the second processor module M2, and the wedging portion 21 can be sufficiently wedged into the position portion 91 of the first processor module M1 or the second processor module M2. When the supporting member 2' is connected to the third processor module M3, the position of the metal element 272 relative to the supporting member body 26 can be modified (forward), the supporting trough 28 is protruding from the wedging portion 21 (as shown in FIG. 4A), and the supporting trough 28 is sufficiently connected to the edge 921 of the substrate 92 of the third processor module M3.

Figure 5A:
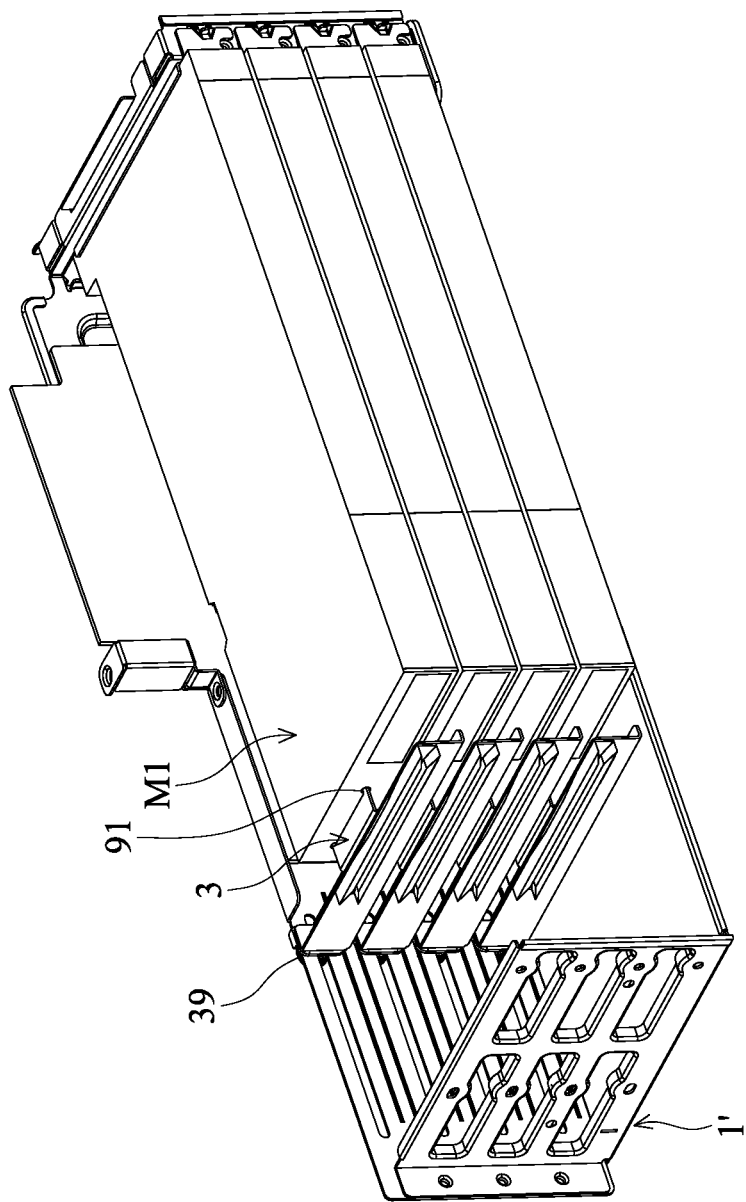
FIG. 5A is a perspective view of an electronic device of a second embodiment of the invention, wherein a first processing module is disposed in the electronic device.
Figure 5B:
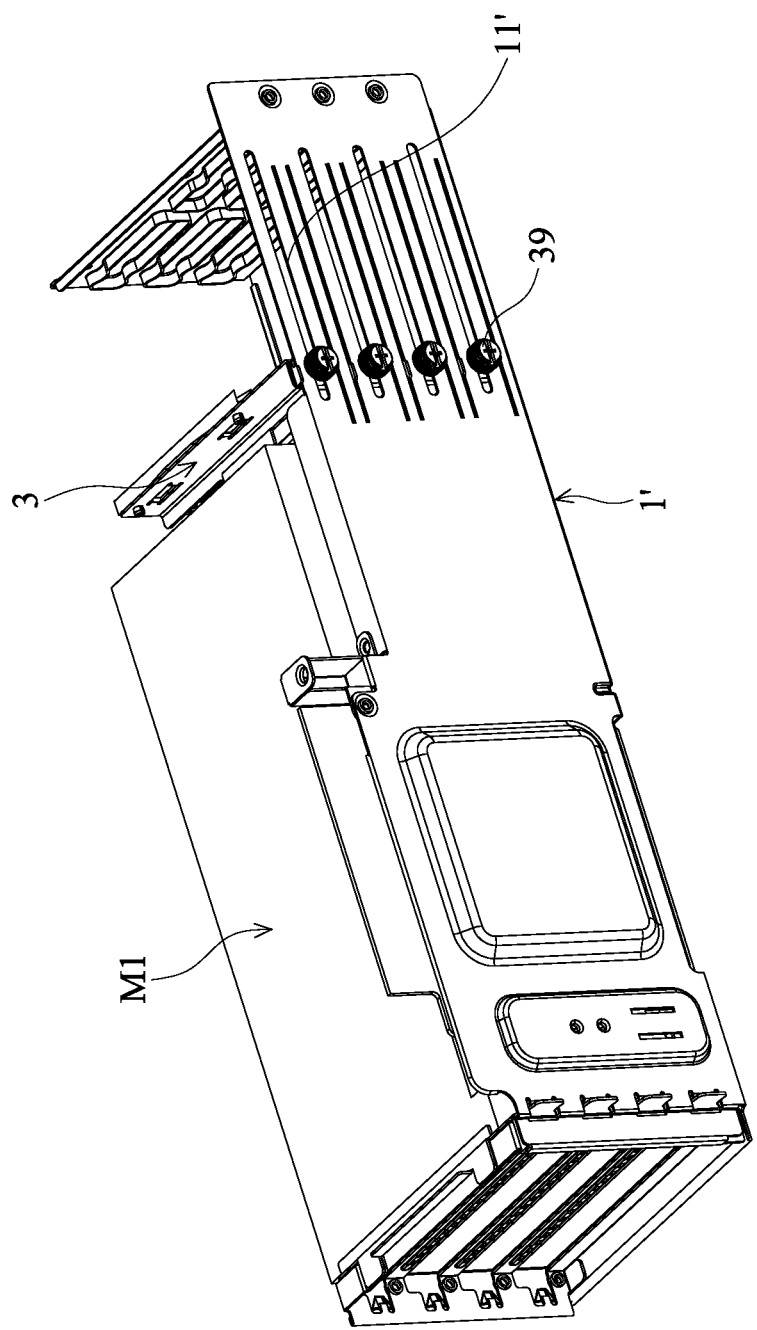
FIG. 5B is another perspective view of the electronic device of the second embodiment of the invention.

FIG. 5A is a perspective view of an electronic device of a second embodiment of the invention, wherein a first processing module is disposed in the electronic device. FIG. 5B is another perspective view of the electronic device of the second embodiment of the invention. With reference to FIGS. 5A and 5B, the electronic device of the second embodiment includes a bracket 1', a supporting member 3, a fastener 39 and a first processor module M1. The bracket 1' comprises a slot 11'. In a fixed state, the fastener 39 is adapted to affix the supporting member 3 in the slot 11'. In an adjustment state, the supporting member 3 is adapted to be slid relative to the slot 11'. The supporting member 3 is connected to the first processor module M1 to restrict the first processor module M1.

Figure 6A:
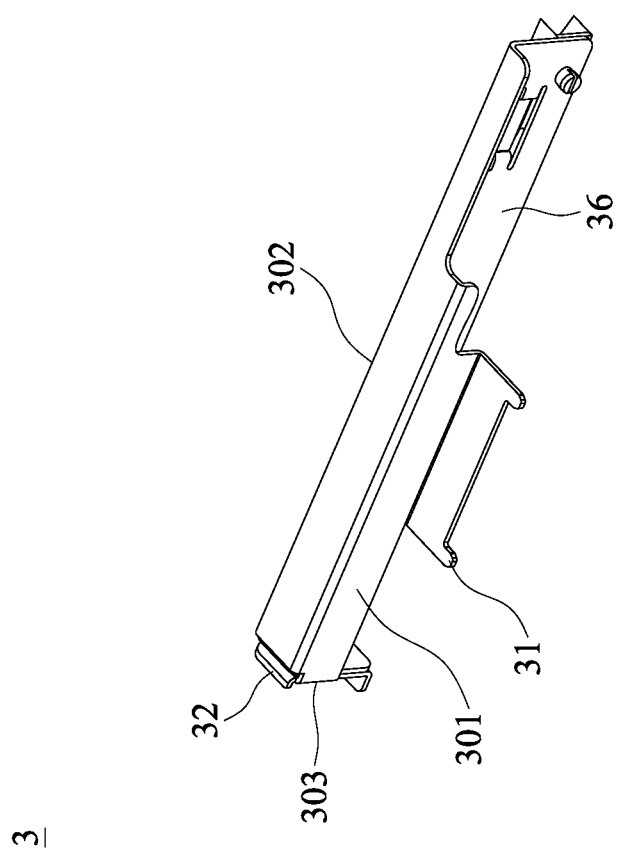
FIGS. 6A and 6B show the details of the supporting member of the second embodiment of the invention.
Figure 6B:
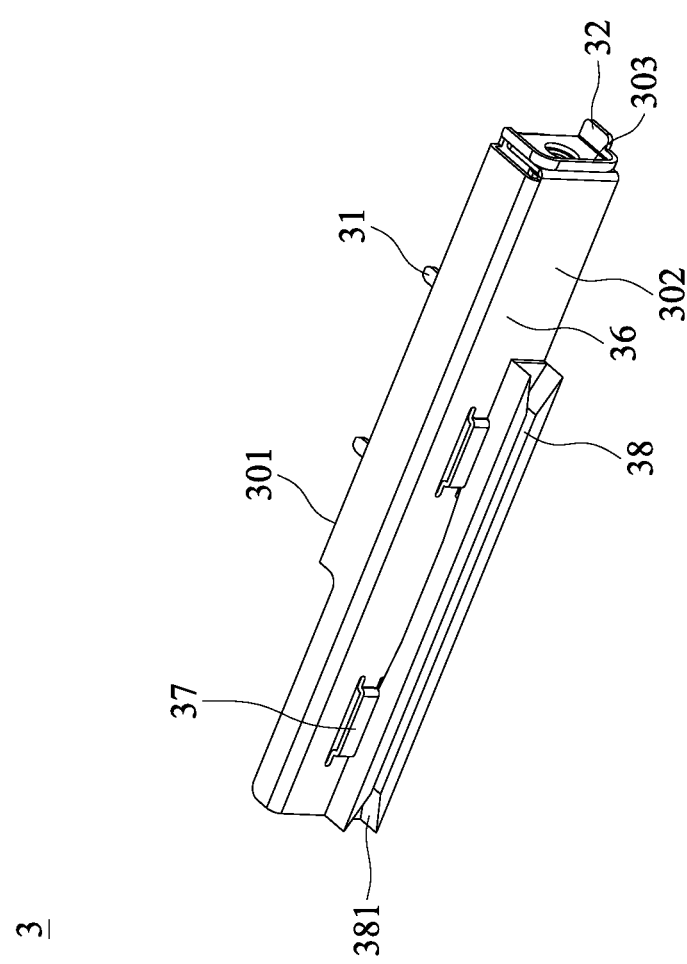

FIGS. 6A and 6B show the details of the supporting member of the second embodiment of the invention. With reference to FIGS. 5A, 6A and 6B, in one embodiment, the supporting member 3 comprises a supporting member body 36 and at least one wedging portion 31. The wedging portion 31 is disposed on the supporting member body 36. In a first assembling state, the first processor module M1 comprises at least one positioning portion 91. The wedging portion 31 is inserted into the positioning portion 91 when the supporting member 3 is connected to the first processor module M1.

With reference to FIGS. 6A and 6B, in one embodiment, the supporting member body 36 comprises a first side 301 and a second side 302. The first side 301 is opposite to the second side 302. The wedging portion 31 is disposed on the first side 301, and the supporting trough 38 is disposed on the second side 302.

With reference to FIGS. 6A and 6B, in one embodiment, the supporting member body 36 comprises an end portion 303. The end portion 303 is located between the first side 301 and the second side 302, and the fastener 39 is connected to the end portion 303.

Figure 7A:
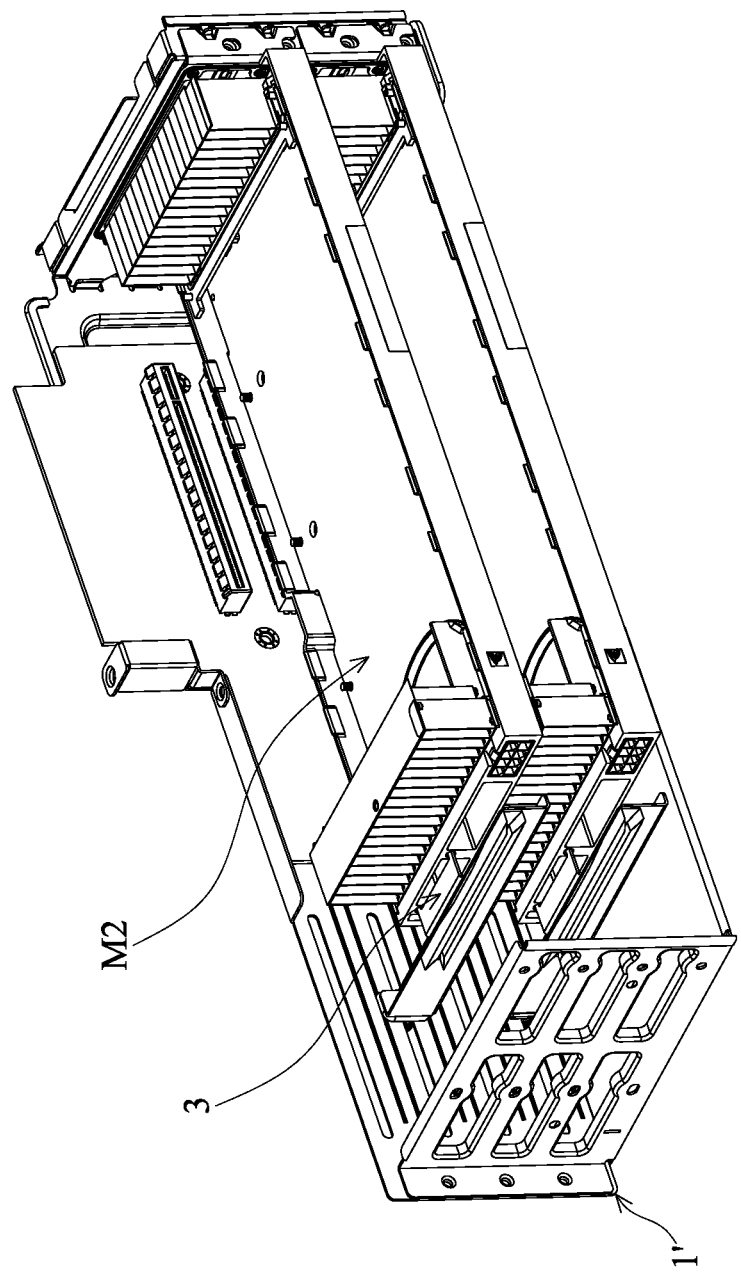
FIG. 7A shows the electronic device of the second embodiment of the invention, wherein a second processing module is disposed in the electronic device.

With reference to FIGS. 5A and 5B, in this embodiment, the first processing module M1 is a 9.5 inches processing module. FIG. 7A shows the electronic device of the second embodiment of the invention, wherein a second processing module is disposed in the electronic device. With reference to FIG. 7A, in this embodiment, the second processing module M2 is a 10.5 inches processing module. The position of the supporting member 3 is modified according to the size of the second processing module M2, and the supporting member 3 restricts the second processing module M2 by the wedging portion 31.

Figure 7B:
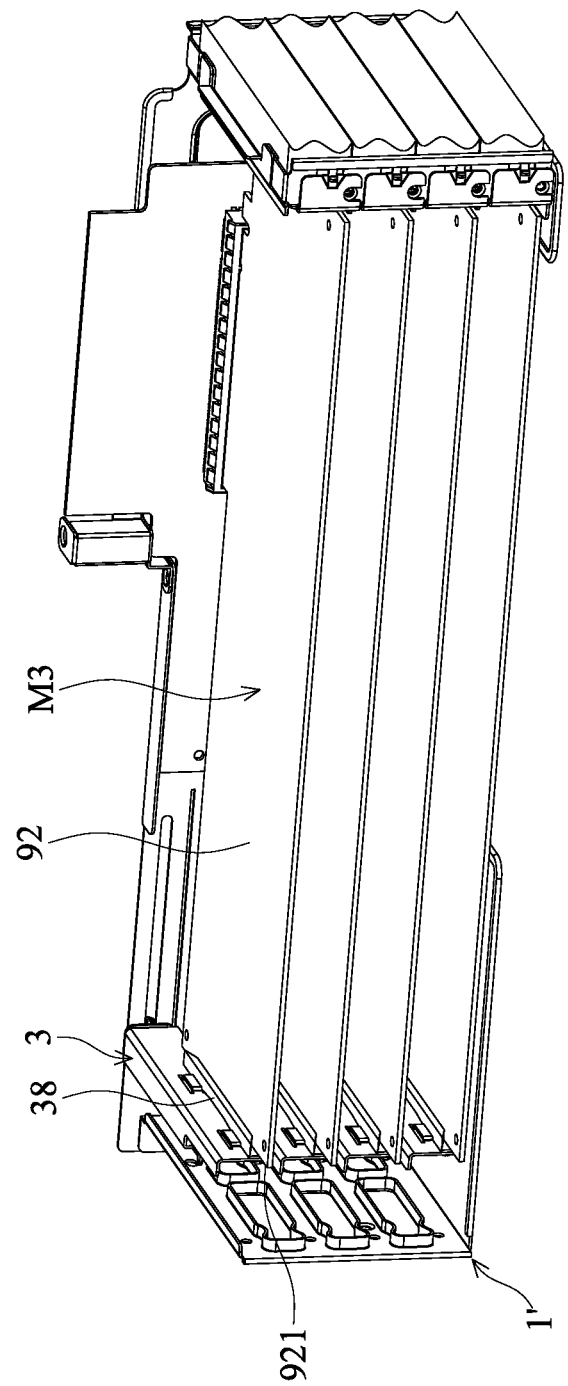
FIG. 7B shows the electronic device of the second embodiment of the invention, wherein a third processing module is disposed in the electronic device.

FIG. 7B shows the electronic device of the second embodiment of the invention, wherein a third processing module is disposed in the electronic device. With reference to FIGS. 6A, 6B and 7B, in this embodiment, the third processing module M3 is a 12.283 inches processing module. In one embodiment, the third processing module M3 is a PCIE card. The length and the wedging structure of the third processing module M3 differs from that of the first processing module M1 and the second processing module M2. In the embodiment of FIG. 7B, the location and the orientation of the supporting member 3 is adjusted according to the size of the third processor module M3. In this embodiment, the supporting member 3 comprises a supporting trough 38. In a second assembling state, the second side 302 (with the supporting trough 38) faces to the third processor module M3, and the first side 301 (with the wedging portion 31) is opposite to the third processor module M3. The third processor module M3 comprises a substrate 92. When the supporting member 3 is connected to the third processor module M3, an edge 921 of the substrate 92 is inserted into the supporting trough 38. In one embodiment, the supporting trough 38 comprises at least one tapering opening 381, and the edge 921 of the substrate 92 is inserted into the supporting trough 38 via the tapering opening 381.

With reference to FIGS. 6B and 7B, in one embodiment, the supporting member further comprises a protrusion 37. As shown in FIG. 7B, in one embodiment, the protrusion 37 is below the supporting trough 38 and abuts the supporting trough 38 to increase the structural of the supporting trough 38.

Figure 8:
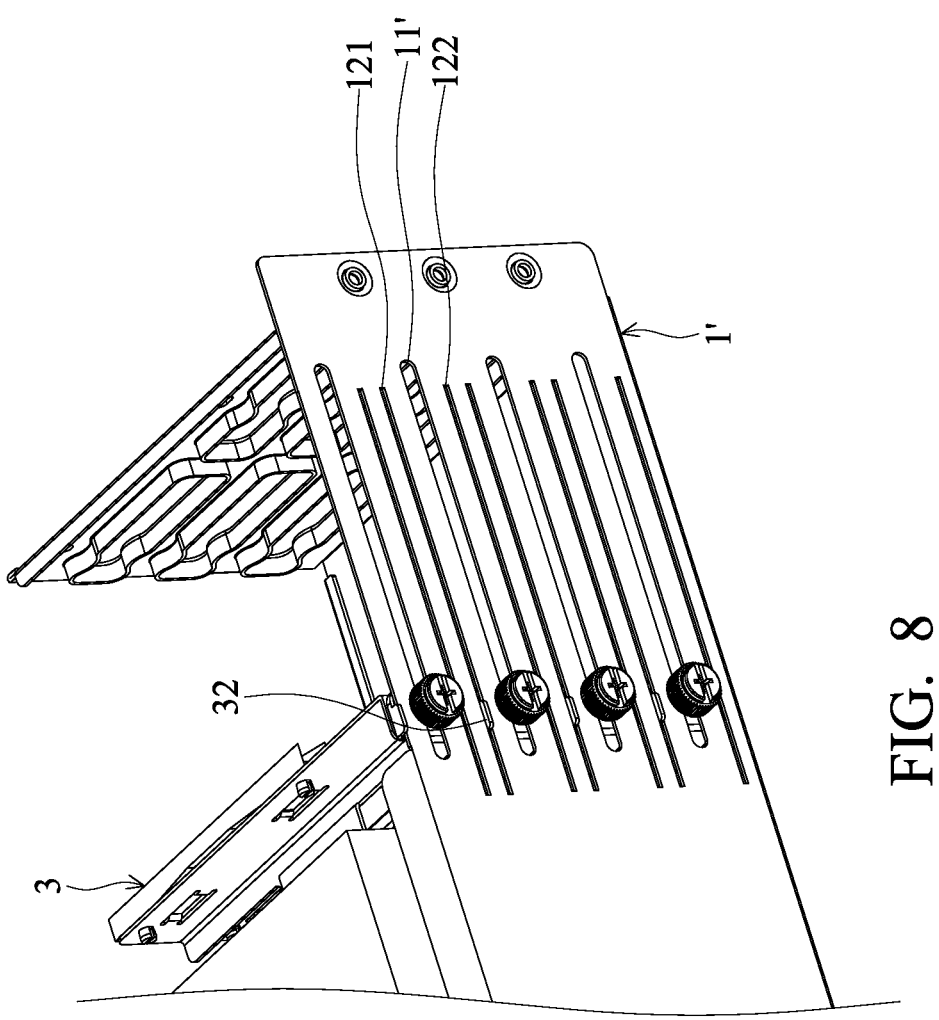
FIG. 8 shows the details of the bracket of the embodiment of the invention.

FIG. 8 shows the details of the bracket of the embodiment of the invention. With reference to FIGS. 6A, 6B and 8, in one embodiment, the bracket 1' comprises a first guiding groove 121 and a second guiding groove 122. The first guiding groove 121 and the second guiding groove 122 are parallel to the slot 11'. The supporting member 3 comprises at least one guiding portion 32. The guiding portion 32 is disposed on the end portion 303 of the supporting member body 36. The guiding portion 32 is adapted to be inserted into the first guiding groove 121 (first assembling state) or the second guiding groove 122 (second assembling state), and is moved along the first guiding groove 121 or the second guiding groove 122.

With reference to FIGS. 1B and 4A, in the embodiment of FIG. 1B, the electronic device has a connector 8. The L-shaped supporting members (2, 2') can leave space for the connector 8, and are prevented from interfering with the connector 8.

With reference to FIGS. 4A and 6A, the supporting members (2', 3) of the embodiments of FIGS. 4A and 6A can support the processor modules of three different sizes.

Utilizing the supporting member of the embodiment of the invention, the PCIE card (12.283 inches) and the graphics processing units of 9.5 inches and the 10.5 inches can be affixed in one single server device. The supporting member of the embodiment can be easily attached to and detached from the server device. The user therefore can mount the graphics processing unit (GPU) and the PCIE card easily.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device, having at least one processor module, comprising:
    a bracket, wherein the bracket comprises a slot;
    a supporting member, wherein the supporting member is moveably affixed in the slot to restrict the processor module; and
    a fastener, wherein the fastener passes through the slot and affixes the supporting member in the slot such that the freedom of movement of the supporting member is restricted in all directions by the fastener.

2. The electronic device as claimed in claim 1, wherein the supporting member comprises a supporting member body and at least one wedging portion, the wedging portion is disposed on the supporting member body, and in a first assembling state, the processor module comprises at least one positioning portion, and the wedging portion is inserted into the positioning portion when the supporting member is connected to the processor module.

3. The electronic device as claimed in claim 2, wherein the supporting member body is L-shaped, the fastener is disposed on a first end of the supporting member body, and the wedging portion is disposed on a second end of the supporting member body.

4. The electronic device as claimed in claim 3, wherein the bracket comprises a guiding groove, the guiding groove is parallel to the slot, the supporting member comprises at least one guiding portion, the guiding portion is disposed on the first end of the supporting member body, and the guiding portion is adapted to be inserted into the guiding groove and is moved along the guiding groove.

5. The electronic device as claimed in claim 2, wherein the supporting member comprises a supporting trough, and in a second assembling state, the processor module comprises a substrate, and an edge of the substrate is inserted into the supporting trough when the supporting member is connected to the processor module.

6. The electronic device as claimed in claim 5, wherein the supporting member further comprises a metal element and a bolt, the supporting trough is disposed on the metal element, the supporting member body has a hole, the bolt passes through the hole to affix the metal element to the supporting member body, and the metal element is adapted to be slid relative to the supporting member body.

7. The electronic device as claimed in claim 5, wherein the supporting member body comprises a first side and a second side, the first side is opposite to the second side, the wedging portion is disposed on the first side, and the supporting trough is disposed on the second side.

8. The electronic device as claimed in claim 7, wherein the supporting member body comprises an end portion, the end portion is located between the first side and the second side, and the fastener is connected to the end portion.

9. The electronic device as claimed in claim 8, wherein the bracket comprises a first guiding groove and a second guiding groove, the first guiding groove and the second guiding groove are parallel to the slot, the supporting member comprises at least one guiding portion, the guiding portion is disposed on the end portion of the supporting member body, and the guiding portion is adapted to be inserted into the first guiding groove or the second guiding groove, and is moved along the first guiding groove or the second guiding groove.

10. A supporting member, adapted to at least affix a first processor module to a bracket, comprising:
    a supporting member body, moveably affixed to the bracket;
    at least one wedging portion, disposed on the supporting member body, wherein the wedging portion is connected to a positioning portion of the first processor module, and when the supporting member is connected to the first processor module, the wedging portion is inserted into the positioning portion; and
    a metal element, wherein the metal element is adapted to be slid relative to the supporting member body.

11. The supporting member as claimed in claim 10, wherein a first end of the supporting member body is affixed to the bracket, and the wedging portion is formed on a second end of the supporting member body.

12. The supporting member as claimed in claim 11, wherein the supporting member comprises at least one guiding portion, and the guiding portion is disposed on the first end of the supporting member body.

13. The supporting member as claimed in claim 10, wherein the supporting member is adapted to be slid relative to the bracket to affix a second processor module to the bracket.

14. The supporting member as claimed in claim 13, wherein the supporting member is adapted to affix a third processor module to the bracket, the supporting member comprises a supporting trough, the third processor module comprises a substrate, and when the supporting member is connected to the third processing module, an edge of the substrate is inserted into the supporting trough.

15. The supporting member as claimed in claim 14, wherein the supporting member further comprises a metal element and a bolt, the supporting trough is disposed on the metal element, the supporting member body has a hole, the bolt passes through the hole to affix the metal element to the supporting member body.

16. The supporting member as claimed in claim 14, wherein the supporting member body comprises a first side and a second side, the first side is opposite to the second side, the wedging portion is disposed on the first side, and the supporting trough is disposed on the second side.

17. The supporting member as claimed in claim 16, wherein the supporting member body comprises an end portion, the end portion is located between the first side and the second side, and the end portion is affixed to the bracket.

18. The supporting member as claimed in claim 14, wherein the supporting trough comprises at least one tapering opening, and the edge of the substrate is inserted into the supporting trough via the tapering opening.

19. An electronic device, comprising:
   a bracket, wherein the bracket comprises a slot;
   a supporting member;
   a fastener, wherein in a fixed state, the fastener is adapted to pass through the slot and affix the supporting member in the slot such that the freedom of movement of the supporting member is restricted in all directions by the fastener, and in an adjustment state, the supporting member is adapted to be slid relative to the slot; and
   a processor module, wherein the supporting member is connected to the processor module to restrict the processor module.

* * * * *